(12) United States Patent
Liu

(10) Patent No.: US 6,795,317 B1
(45) Date of Patent: Sep. 21, 2004

(54) FASTENING DEVICE

(76) Inventor: A-Sheng Liu, No. 16, Wu Lin St., Shu Lin City, Taipei Hsien (TW)

( * ) Notice: Subject to any disclaimer, the term of this patent is extended or adjusted under 35 U.S.C. 154(b) by 0 days.

(21) Appl. No.: 10/618,646

(22) Filed: Jul. 15, 2003

(51) Int. Cl.[7] ................................................. H05K 7/20
(52) U.S. Cl. ...................... 361/704; 361/710; 361/719; 361/720; 165/80.3; 257/718; 257/719; 257/727; 24/453; 24/458
(58) Field of Search ................................ 361/690, 695, 361/704, 707, 709, 719; 257/718–722, 727; 174/16.3; 165/80.2; 24/293–296, 453, 458

(56) References Cited

U.S. PATENT DOCUMENTS

| | | | | |
|---|---|---|---|---|
| 5,730,210 A | * | 3/1998 | Kou | ........................... 165/80.3 |
| 6,055,159 A | * | 4/2000 | Sun | ............................. 361/704 |
| 6,201,697 B1 | * | 3/2001 | McCullough | ............... 361/704 |
| 6,392,889 B1 | * | 5/2002 | Lee et al. | ................... 361/704 |
| 6,552,905 B2 | * | 4/2003 | Herring et al. | ............. 361/704 |

\* cited by examiner

*Primary Examiner*—Boris Chervinsky
(74) *Attorney, Agent, or Firm*—Rosenberg, Klein & Lee

(57) ABSTRACT

A fastening device for connecting an attached component to a printed circuit board (PCB) has an elongated body, an operating member and a resilient member. The elongated body penetrates through the attached component and the PCB, and has a reducing section disposed at a lower half thereof and a protruding portion positioned on a free end thereof. The operating member eccentrically pivots to the elongated body, and has an eccentric body and a pressing arm outwardly extending from the eccentric body. The resilient member sleeves on an upper half of the elongated body. The resilient member has a clipping portion disposed at an end thereof and tightly contacting the reducing section. The protruding portion is consequently uplifted to force the clipping portion horizontally supporting a bottom of the PCB while the pressing arm is pushed downwardly, such that the attached component is connected to the PCB.

13 Claims, 7 Drawing Sheets

FASTENING DEVICE

BACKGROUND OF THE INVENTION

1. Field of the Invention

The present invention relates to a fastening device. More particularly, the present invention relates to a fastening device for easily operating and firmly buckling and adopted for mounting a component on a printed circuit board (PCB).

2. Description of Related Art

As computer components develop and electronic devices improve by, for example, increasing of a frequency of a central processing unit (CPU), or enlarging a volume of a heat sink relative to the CPU, a fastening device that is used for firmly mounting the computer components to keep the CPU tight or containing heat dissipation of the heat sink is needed.

Referring to FIG. 1, T.W. Patent No 500244 discloses a first prior art fastening device for mounting an attached component 2a tightly on a PCB 3a. The first prior art includes a buckling member 1a, a positioning 20a formed on the attached component 2a, and a through hole 30a formed in the PCB 3a.

The buckling member 1a includes a posting body 10a, a cap 11a disposed at an end of the posting body 21 and a clip 12a disposed at an opposite end of the posting body 10a. The cap 11a is cylindrical in shape. A diameter of the cap 11a is larger than a diameter of the posting body 10a and thus the cap 11a is retained against the attached component 2a while the buckling member 1a penetrates through the positioning hole 20a of the attached component 2a. The clip 12a is in an inverted cone in shape. A diameter of a root of the clip 12a is larger than the diameter of the posting body 21 and thus the clip 12a is retained against the PCB 3a while the buckling member 1a penetrates through a through hole 30a of the PCB 3a. The buckling member 1a further has a longitudinal crevice formed in each middle of the posting body 10a and the clip 12a for increasing the resilience of the buckling member 1a.

However, the first prior art fastening device cannot effectively buckle the CPU or the heat sink thereto, and the clip 12a becomes loose and disengages when vibrated or impacted.

As shown in FIG. 2, T.W. Patent No 511738 discloses a second prior art fastening device for mounting an attached component 2b tightly on a PCB 3b. The second prior art includes a buckling member 1b, a positioning 20b formed on the attached component 2b, and a through hole 30b formed on the PCB 3ba.

The buckling member 1b includes an elongated body 10b penetrating the positioning hole 20b of the attached component 2b and the through hole 30b of the PCB 30, an operating member 11b pivotally connected to a top of the elongated body 10b and a spring 14b sleeved on the elongated body 10b. The elongated body 10b has a head 13b connected at a bottom thereof and a flange 12b horizontally extending outwards from a predetermined position adjacent to the: bottom thereof, respectively, for avoiding the buckling member 1b falling off. The fastening device further includes a supporting plate 4b below the PCB 3b for increasing a supporting strength of the PCB 3b. The supporting plate 4b has a through hole 40b relative to the through hole 30b of the PCB 3b for further fastening with the head 13b of the elongated body 10b.

But the second prior art fastening device is complex and difficult to assemble because of the elongated body 10b first penetrating the positioning hole 20b of the attached component 2b from a bottom of the attached component 2b to a top thereof; the spring 14b second sleeved on the positioning hole 20b, which protrudes out above and from the top of the attached component 2b and the operating member 11b further pivotally connecting to a top of the elongated body 10b.

SUMMARY OF THE INVENTION

A primary object of the present is to provide a fastening device for firmly connecting an attached component to a PCB, and includes an elongated body, an operating member and a resilient member. The elongated body penetrates through the attached component and the PCB. The protruding portion is consequently uplifted to force a clipping portion of the resilient member to support horizontally a bottom of the PCB while the pressing arm is pushed downwardly, such that the attached component is connected to the PCB. The objects of firmly connecting the attached component to the PCB, simplifying assembly steps, cutting down costs, and improving manufacturing efficiency are achieved at the same time.

A fastening device according to the present invention is used to connect firmly an attached component to a PCB. The attached component and the PCB each has hole, and the fastening device includes an elongated body, an operating member, a spring and a resilient member. The elongated body penetrates through the attached component and the PCB, and has a reducing section disposed at a lower half thereof and a protruding portion positioned on a free end thereof. The operating member eccentrically pivots on the elongated body, and has an eccentric body and a pressing arm outwardly extending from the eccentric body. The spring and the resilient member respectively sleeve at an upper half of the elongated body. The resilient member has a clipping portion disposed at an end thereof and tightly contacting the reducing section. The present invention utilizes the protruding portion consequently uplifted to force the clipping portion to support horizontally a bottom of the PCB while the pressing arm is pushed downwardly, such that the objects of firmly connecting the attached component to the PCB, cutting down costs, and improving manufacturing efficiency are achieved. Further, the fastening device consequently penetrates the attached component and the PCB to connect directly to achieve another object of simplifying assembly steps at the same time.

To provide a further understanding of the invention, the following detailed description illustrates embodiments and examples of the invention. Examples of the more important features of the invention thus have been summarized rather broadly in order that the detailed description thereof that follows may be better understood, and in order that the contributions to the art may be appreciated. There are, of course, additional features of the invention that will be described hereinafter and which will form the subject of the claims appended hereto.

BRIEF DESCRIPTION OF THE DRAWINGS

The drawings included herein provide a further understanding of the invention. A brief introduction of the drawings is as follows.

DETAILED DESCRIPTION OF PREFERRED EMBODIMENTS

Figure 1:
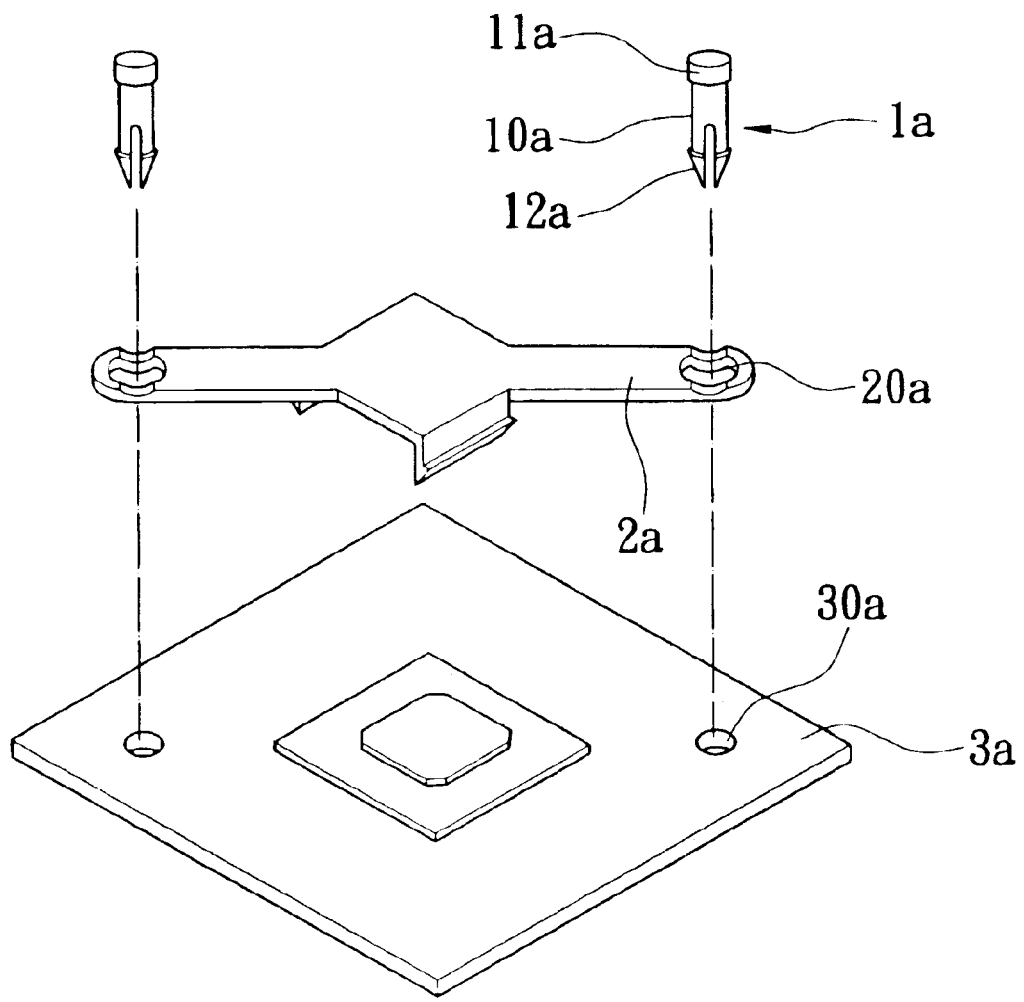
FIG. 1 is a decomposed view of a first prior art fastening device.
Figure 2:
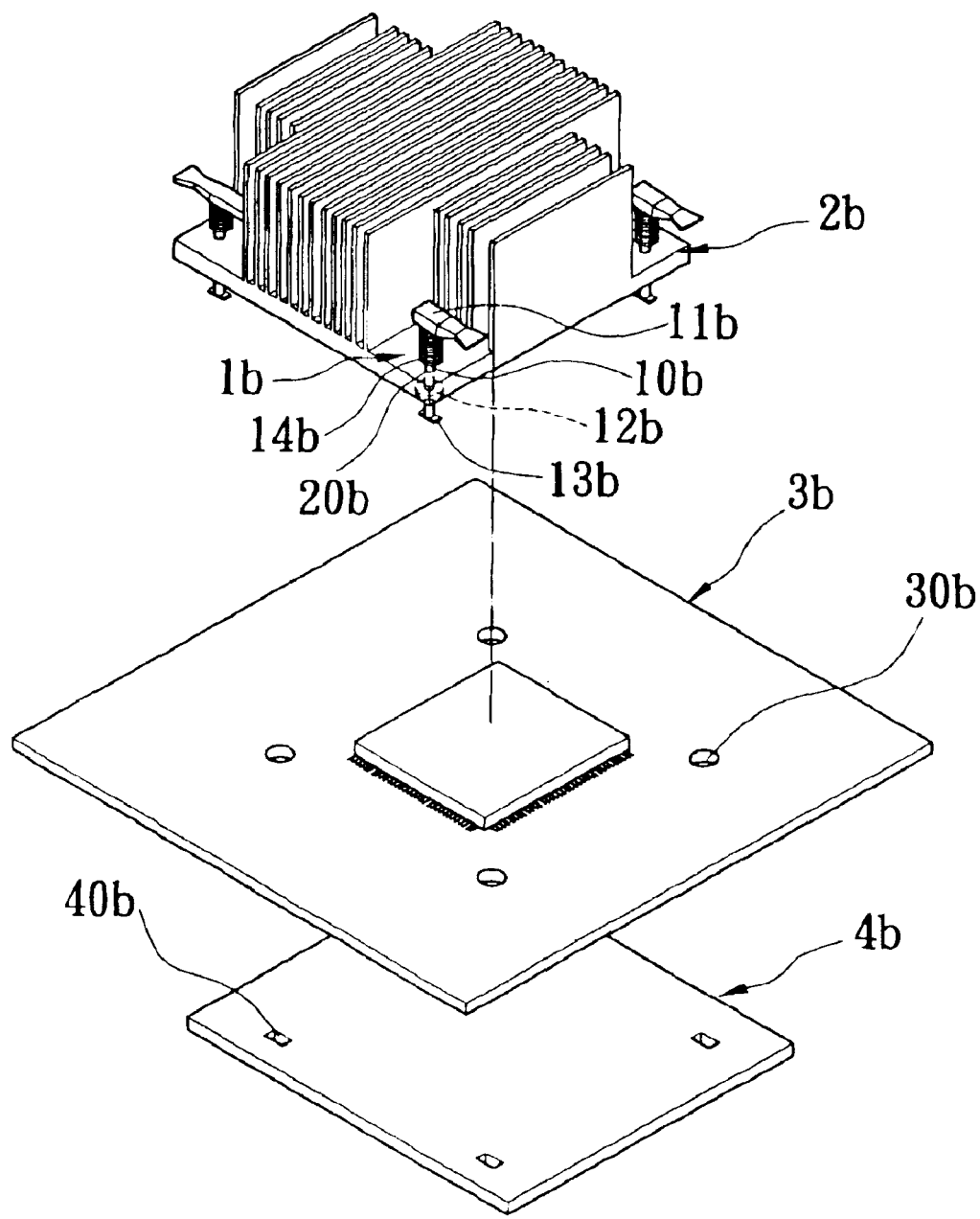
FIG. 2 is a decomposed view of a second prior art fastening device.
Figure 3:
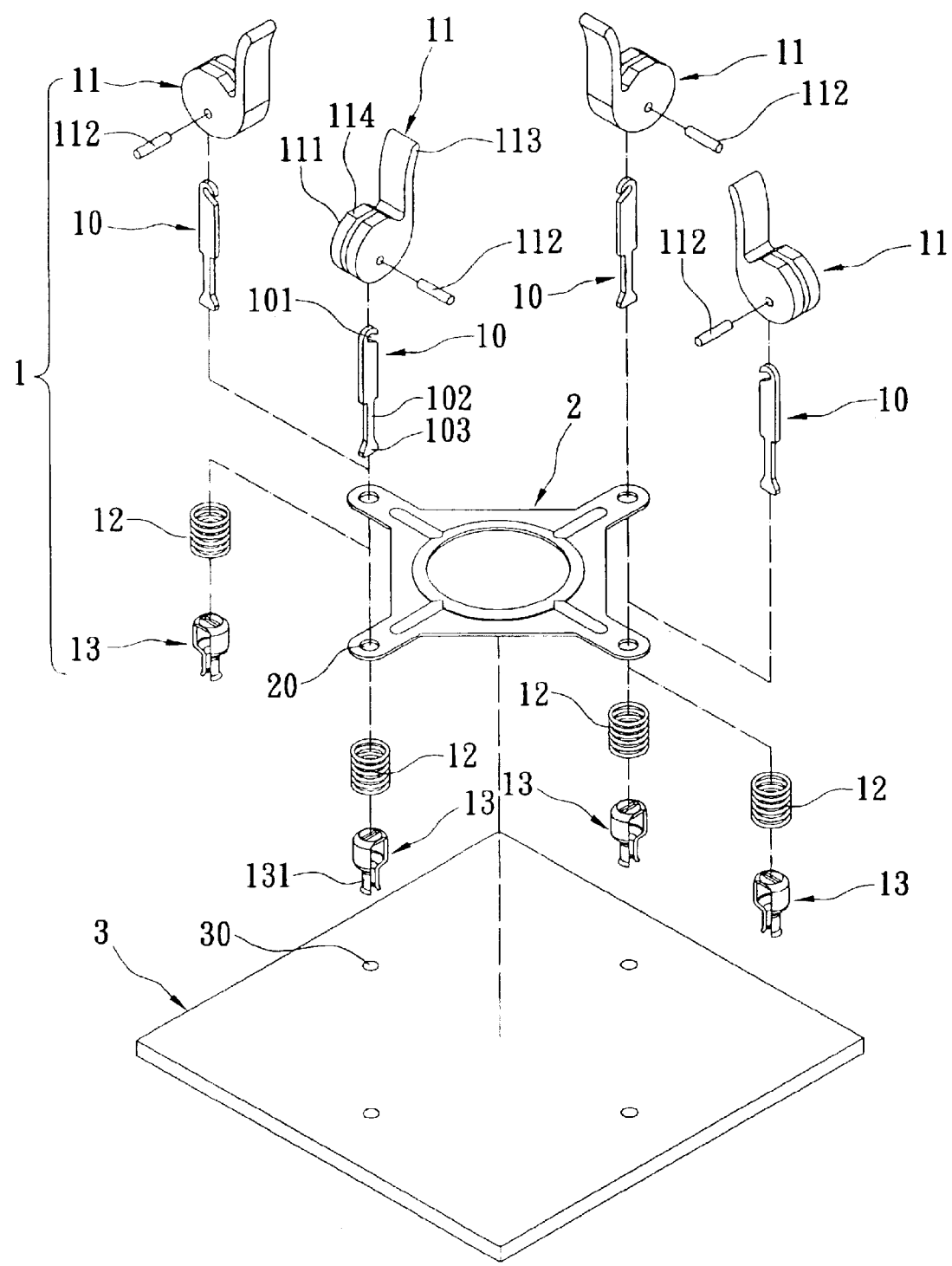
FIG. 3 is a decomposed view according to a first embodiment of the present invention fastening device.

Referring to FIG. 3, which is a decomposed view according to a first embodiment of the present invention fastening device, the present invention provides a fastening device 1 adopted for connecting an attached component 2 to a printed circuit board (PCB) 3. The attached component 2 has a positioning hole 20 relative to the fastening device 1, and the PCB 3 has a through hole 30 relative to the positioning hole 20. The fastening device 1 includes an elongated body 10 penetrating through the positioning hole 20 and the through hole 30, an operating member 11 eccentrically pivoted on a top of the elongated body 10, a spring 12 and a resilient member 13 sequently sleeved on an upper half of the elongated body 10. The present invention utilizes pressing the operating member 11 to consequently uplift the elongated body 10, so as to a bottom of the elongated body 10 forces the resilient member 13 in a condition for the resilient member 13 to retain and support horizontally a bottom of the PCB 3 from a condition for the resilient member 13 to contact vertically the elongated body 10, and firmly fastens the attached component 2 to the PCB 3.

The elongated body 10 includes a pivoted connecting portion 101 arranged on the top thereof, a reducing section disposed at a lower half thereof, penetrating the through hole 30 and having a reducing cross-sectional area, and a protruding portion 103 positioned on a free end thereof, wherein the pivoted connecting portion 101 is located above the positioning hole 20 and the protruding portion 103 is located below the through hole 30.

The pivoted connecting portion 101 includes an aperture downwards inclined from the top of the elongated body 10.

The operating member 11 has an eccentric body 111, an eccentric shaft 112 arranged in the eccentric body 111 and connecting the pivoted connecting portion 101 of the elongated body 10, a pressing arm 113 outwardly extending from the eccentric body 111, and a retaining face 114 formed at an outer face of the eccentric body 111.

The eccentric body 111 includes an eccentric cylinder or an eccentric sphere. The eccentric shaft 112 and the eccentric body 111 are made integrally in a piece or are combined to be a piece. The pressing arm has a tail inclined outwards for easy manipulation.

The spring 12 is located below the attached component 2.

The resilient member 13 has an inversed U-shaped profile and is sleeved on the upper half of the elongated body 10 below the spring 12. The resilient member 13 has two clipping portions 131 deflecting inwardly, each disposed on an end of the resilient member 13, and penetrating the through hole 30 for tightly retaining against the reducing section 162 of the elongated body 10, wherein the two clipping portions 131 are arranged symmetrically.

The retaining face 114 is used for increasing a frictional force relative to a frictional area while the retaining face 114 is retained against the attached component 2 in a buckling condition.

As the fastening device 1 is assembled, the elongated body 10 penetrates consequently through the positioning hole 20 and the through hole 30 first. The fastening device 1 is then rotated a predetermined angle and the pressing arm 113 thus is downwardly pushed to fasten the attached component 2 to the PCB 3. The present invention fastening device 1 therefore achieves one object of simplifying manufacturing steps.

Figure 3A:
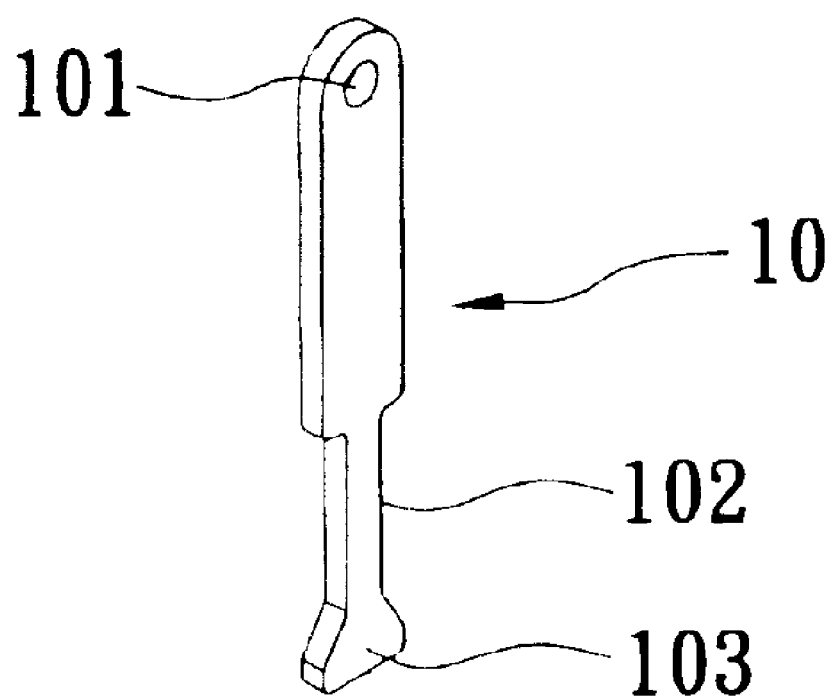
FIG. 3A is an enlarged view according to a second embodiment of the present invention fastening device.

Referring to FIG. 3A, which is the enlarged view according to a second embodiment of the present invention fastening device, the pivoted connecting portion 101 includes a through hole formed on the top of the elongated body 10.

Figure 3B:
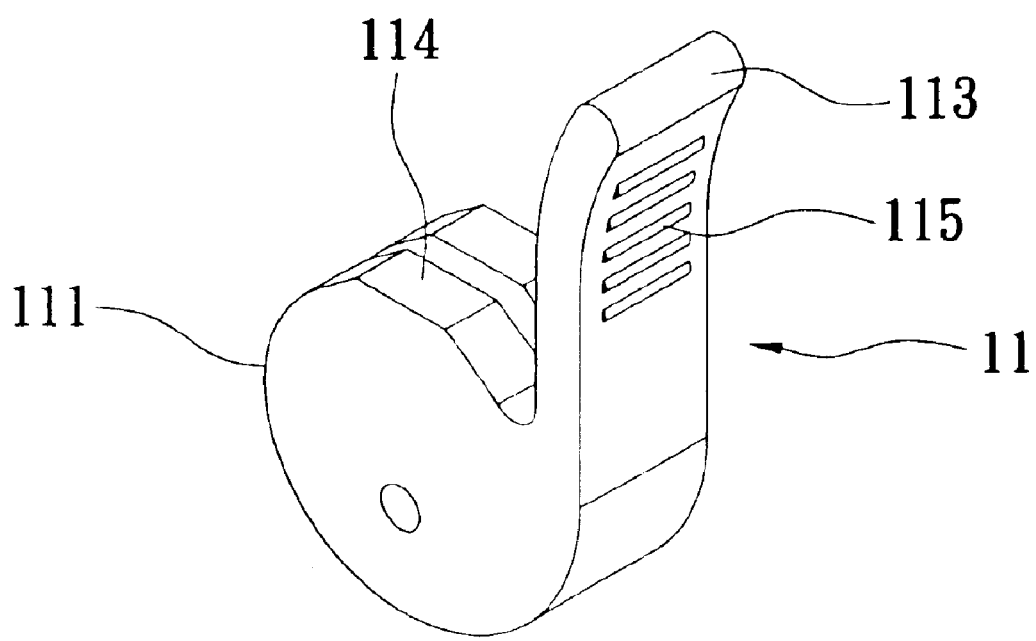
FIG. 3B is an enlarged view according to a third embodiments of the present invention fastening device.

Referring to FIG. 3B, which is the enlarged view according to a third embodiment of the present invention fastening device, the pressing arm 113 further includes a plurality of patterns 115 protruding from an outer surface thereof for easy manipulation.

Figure 4:
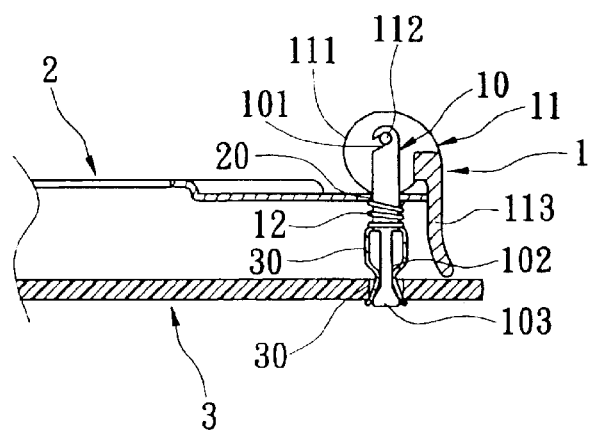
FIG. 4 is a buckling perspective view according to the first embodiment of the present invention fastening device.

Referring to FIG. 4, which is the buckling perspective view according to the first embodiment of the present invention fastening device 1, when the pressing arm 113 is downwardly pushed, the elongated body 10 is consequently uplifted because of the variation of the eccentric shaft 112, such that the protruding portion 103 consequently uplifted relative to the elongated body 10 to force the two clipping portions 131 of the resilient member 13, the two clipping portions 131 thus in a condition for horizontally retaining and supporting the bottom of the PCB 3 in the original condition for vertically contacting the reducing section 102. The present invention fastening device 1 therefore achieves one object of firmly fastening the attached component 2 to the PCB 3.

Figure 5:
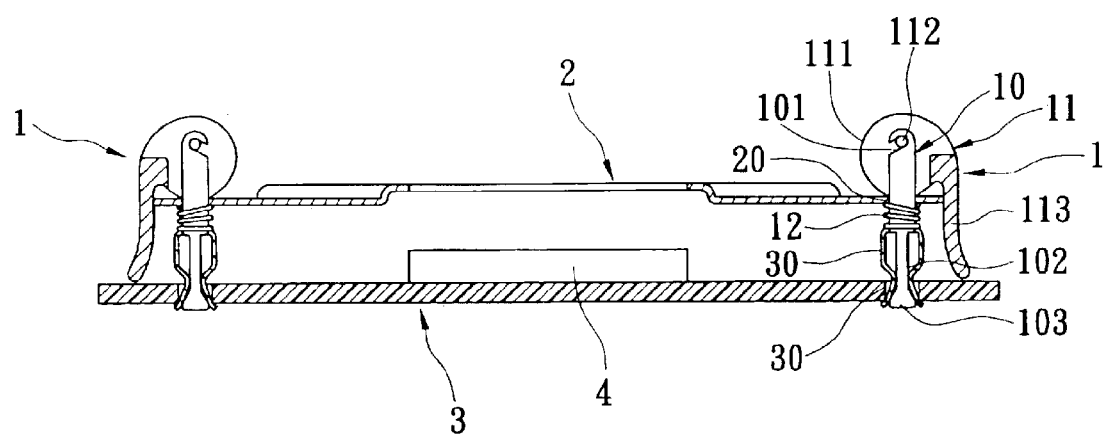
FIG. 5 is a perspective view of a first application according to the first embodiment of the present invention fastening device.

Referring to FIG. 5, which is the perspective view of a first application according to the first embodiment of the present invention fastening device, the attached component 2 includes a protecting frame of a CPU 4. The protecting frame 2 of the first application protects the CPU 4, and the fastening device 1 penetrates the positioning hole 20 and the through hole 30 for firmly fastening the protecting frame 2.

Figure 6:
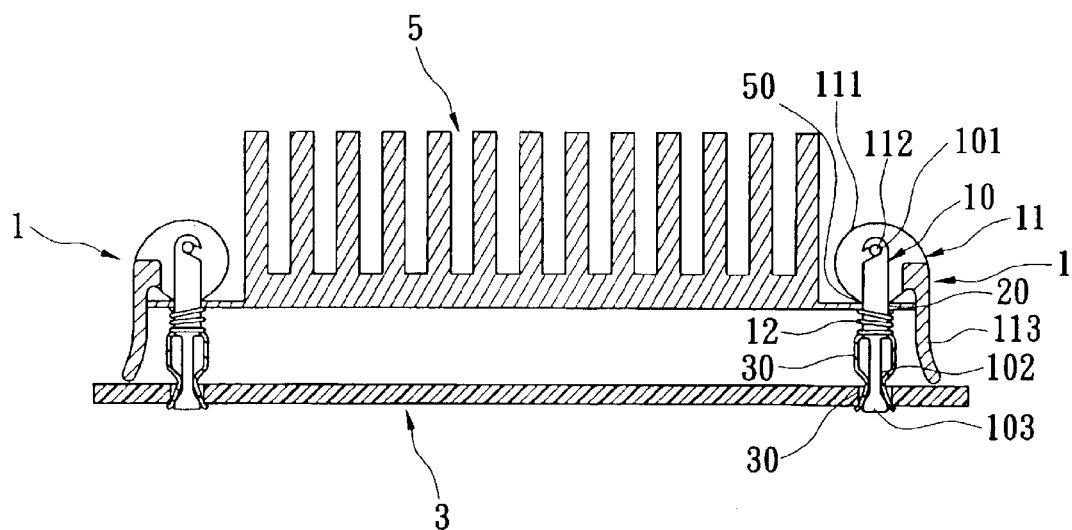
FIG. 6 is a perspective view of a second application according to the first embodiment of the present invention fastening device.

Referring to FIG. 6, which is the perspective view of a second application according to the first embodiment of the present invention fastening device, the attached component 2 includes a heat sink 5. The fastening device 1 penetrates the positioning hole 50 of the heat sink 5 and the through hole 30 of the PCB 3 for firmly fastening the heat sink 5.

Figure 7:
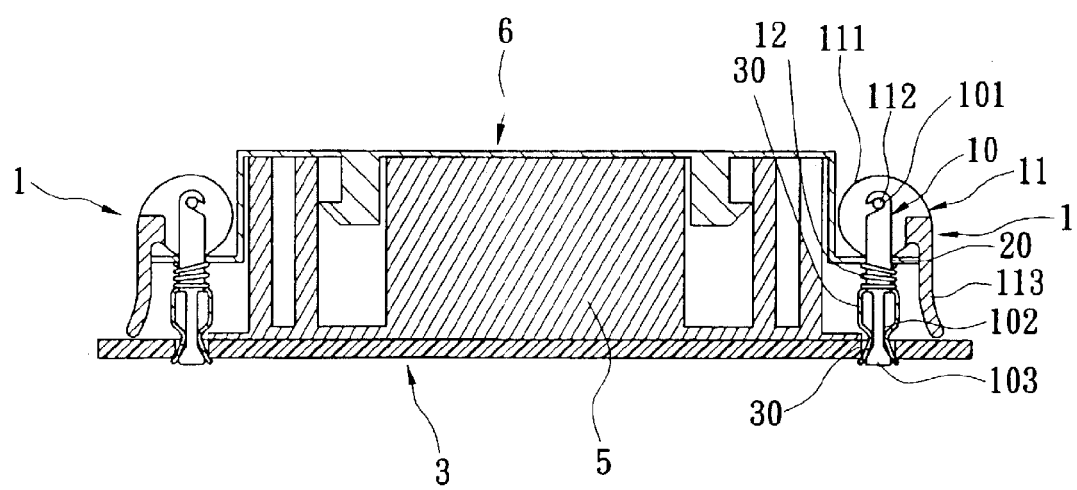
FIG. 7 is a perspective view of a third application according to the first embodiment of the present invention fastening device.

Referring to FIG. 7, which is the perspective view of a third application according to the first embodiment of the present invention fastening device, the attached component 2 includes a suppressing member 6 of the heat sink 5. The fastening device 1 penetrates the positioning hole 60 of the suppressing member 6 and the through hole 30 of the PCB 3 for firmly fastening the suppressing member 6.

The present invention utilizes the two clipping portions 131 of the resilient member 13 tightly retaining against the bottom of the PCB 3 to achieve one object of firmly fastening the attached component 2 to the PCB 3, and further utilizes simple assembly steps for cutting down manufacturing costs and improving manufacturing efficiency.

It should be apparent to those skilled in the art that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. A fastening device adopted for connecting an attached component to a printed circuit board (PCB), wherein the attached component has a positioning hole relative to the fastening device, the PCB has a through hole relative to the positioning hole, the fastening device comprising:
    an elongated body penetrating sequentially through the positioning hole and the through hole, and having a pivoted connecting portion arranged on a top thereof, a reducing section disposed at a lower half thereof and a protruding portion positioned on a free end thereof, wherein the pivoted connecting portion is located above the positioning hole and the protruding portion is located below the through hole;
    an operating member eccentrically pivoted on the top of the elongated body and having an eccentric body, an eccentric shaft arranged in the eccentric body and connecting the pivoted connecting portion of the elongated body, and a pressing arm outwardly extending from the eccentric body;
    a spring sleeved on an upper half of the elongated body and locating below the attached component; and
    a resilient member having an inversed U-shaped profile and sleeved on the upper half of the elongated body below the spring, the resilient member having two clipping portions deflecting inwardly, each disposed on an end of the resilient member, and penetrating the through hole for tight retention against the reducing section of the elongated body, wherein the two clipping portions are arranged symmetrically.

2. The fastening device of claim 1, wherein the operating member further includes a retaining face formed on an outer face of the eccentric body for increasing a frictional area while the retaining face is retained against the attached component when buckled.

3. The fastening device of claim 1, wherein the eccentric body includes an eccentric cylinder.

4. The fastening device of claim 1, wherein the eccentric body includes an eccentric sphere.

5. The fastening device of claim 1, wherein the eccentric shaft and eccentric body are made integrally in a single piece.

6. The fastening device of claim 1, wherein the eccentric shaft and eccentric body are combined into a piece.

7. The fastening device of claim 1, wherein the pivoted connecting portion includes an aperture downwards inclined from the top of the elongated body.

8. The fastening device of claim 1, wherein the pivoted connecting portion includes a through hole formed on the top of the elongated body.

9. The fastening device of claim 1, wherein the pressing arm has a tail inclined outwards for easy manipulation.

10. The fastening device of claim 9, wherein the pressing arm further includes a plurality of patterns protruding on an outer surface thereof for easy manipulation.

11. The fastening device of claim 1, wherein the attached component includes a heat sink.

12. The fastening device of claim 1, wherein the attached component includes a suppressing member of a heat sink.

13. The fastening device of claim 1, wherein the attached component includes a protecting frame of a central processing unit (CPU).

* * * * *